United States Patent
Fang et al.

(10) Patent No.: US 12,369,443 B2
(45) Date of Patent: Jul. 22, 2025

(54) DIODE PACKAGE STRUCTURE AND MANUFACTURING METHOD THEREOF

(71) Applicant: Lextar Electronics Corporation, Hsinchu (TW)

(72) Inventors: Yu-Jing Fang, Hsinchu (TW); Hsiang-Chun Hsu, Hsinchu (TW); Cheng-Ping Chang, Hsinchu (TW)

(73) Assignee: Lextar Electronics Corporation, Hsinchu (TW)

( * ) Notice: Subject to any disclaimer, the term of this patent is extended or adjusted under 35 U.S.C. 154(b) by 0 days.

(21) Appl. No.: 18/743,135

(22) Filed: Jun. 14, 2024

(65) Prior Publication Data

US 2024/0339572 A1     Oct. 10, 2024

Related U.S. Application Data

(62) Division of application No. 17/447,574, filed on Sep. 13, 2021, now Pat. No. 12,040,434.

(30) Foreign Application Priority Data

Dec. 16, 2020 (TW) ................. 109144520

(51) Int. Cl.
*H10H 20/855* (2025.01)
*H01L 21/56* (2006.01)
(Continued)

(52) U.S. Cl.
CPC ......... *H10H 20/855* (2025.01); *H01L 21/565* (2013.01); *H01L 23/3135* (2013.01); *H10F 71/00* (2025.01); *H10F 77/413* (2025.01); *H10F 77/50* (2025.01); *H10H 20/01* (2025.01); *H10H 20/853* (2025.01); *H10H 20/0362* (2025.01); *H10H 20/0363* (2025.01)

(58) Field of Classification Search
CPC .... H10H 20/855; H10H 20/01; H10H 20/853; H10H 20/0362; H10H 20/0363; H10F 77/413; H10F 71/00; H10F 77/50; H01L 21/565; H01L 23/3135
See application file for complete search history.

(56) References Cited

U.S. PATENT DOCUMENTS

| 8,541,801 B2 | 9/2013 | Kim et al. |
| 9,502,623 B1 | 11/2016 | Miyamoto et al. |

(Continued)

FOREIGN PATENT DOCUMENTS

| CN | 102308399 A | 1/2012 |
| CN | 107438899 A | 12/2017 |

(Continued)

*Primary Examiner* — Samuel A Gebremariam
(74) *Attorney, Agent, or Firm* — CKC & Partners Co., LLC

(57) ABSTRACT

A diode package structure includes a substrate, at least one diode chip and an opaque encapsulating layer. The substrate has an electrically conductive layer. At least one diode chip is mounted on the substrate and electrically connected to the electrically conductive layer. The opaque encapsulating layer has a cap portion and a sidewall portion, wherein the sidewall portion is connected to and surrounds the substrate to jointly form a concave structure, the cap portion is connected between a sidewall of the diode chip and the sidewall portion, wherein a first contact vertex of the cap portion and the sidewall of the diode chip is higher than a second contact vertex of the cap portion and the sidewall portion.

7 Claims, 4 Drawing Sheets

(51) Int. Cl.
  *H01L 23/31*   (2006.01)
  *H10F 71/00*   (2025.01)
  *H10F 77/40*   (2025.01)
  *H10F 77/50*   (2025.01)
  *H10H 20/01*   (2025.01)
  *H10H 20/853*  (2025.01)

(56)          References Cited

U.S. PATENT DOCUMENTS

| | | |
|---|---|---|
| 2010/0176417 A1 | 7/2010 | Wang |
| 2016/0276546 A1 | 9/2016 | Lee et al. |
| 2016/0293811 A1 | 10/2016 | Hussell et al. |
| 2017/0295340 A1 | 10/2017 | Metrani et al. |
| 2019/0363232 A1 | 11/2019 | Murthy et al. |
| 2019/0371974 A1 | 12/2019 | Hussell |
| 2020/0105984 A1 | 4/2020 | Damborsky et al. |

FOREIGN PATENT DOCUMENTS

| | | |
|---|---|---|
| CN | 109087982 A | 12/2018 |
| JP | 2003318448 A | 11/2003 |
| TW | I518948 B | 1/2016 |
| TW | I616005 B | 2/2018 |
| TW | 201814924 A | 4/2018 |
| TW | 201906197 A | 2/2019 |
| TW | I662723 B | 6/2019 |
| TW | 202018966 A | 5/2020 |
| TW | 202023067 A | 6/2020 |
| TW | 202034414 A | 9/2020 |

DIODE PACKAGE STRUCTURE AND MANUFACTURING METHOD THEREOF

CROSS-REFERENCE TO RELATED APPLICATION

This application is a divisional of U.S. application Ser. No. 17/447,574, filed on Sep. 13, 2021, which claims priority to Taiwan Application Serial Number 109144520, filed Dec. 16, 2020, all of which are herein incorporated by reference in their entireties.

BACKGROUND

Field of Invention

The present disclosure relates to a diode package structure and manufacturing method thereof.

Description of Related Art

Light emitting diode is a light-emitting element made of semiconductor material that can convert electrical energy into light. It has the advantages of small size, high energy conversion efficiency, long life, power saving, etc., so it can be widely used as light source in various electronic applications.

The light emitting diode packaging structure includes various packaging colloids to meet different needs. Different types of packaging colloids often cause the interface between different colloids to easily peel off due to the different properties of the colloid materials. In view of this, suppliers need various solutions to control the situation of interface peeling.

SUMMARY

One aspect of the present disclosure is to provide a diode package structure, which includes a substrate, at least one diode chip and an opaque encapsulating layer. The substrate has an electrically conductive layer. At least one diode chip is mounted on the substrate and electrically connected to the electrically conductive layer. The opaque encapsulating layer has a cap portion and a sidewall portion, wherein the sidewall portion is connected to and surrounds the substrate to jointly form a concave structure, the cap portion is connected between a sidewall of the diode chip and the sidewall portion, wherein a first contact vertex of the cap portion and the sidewall of the diode chip is higher than a second contact vertex of the cap portion and the sidewall portion.

Another aspect of the present disclosure is to provide a diode package structure manufacturing method, which includes following steps of providing a substrate; mounting diode chips on the substrate; forming a first opaque encapsulating layer among the diode chips; forming a transparent encapsulating layer to cover the diode chips and the first opaque encapsulating layer; forming a trench to expose the substrate in an area where the transparent encapsulating layer and the first opaque encapsulating layer are overlapped; and filling a second opaque encapsulating layer in the trench, wherein a first contact vertex of the first opaque encapsulating layer and a sidewall of each diode chip is higher than a second contact vertex of the first opaque encapsulating layer and the second opaque encapsulating layer.

In one or more embodiments, an interface is formed between the transparent encapsulating layer and the second opaque encapsulating layer, an angle between the interface and a connection line between the first contact vertex and the second contact vertex is an acute angle.

In one or more embodiments, the diode package structure further includes a transparent encapsulating layer filled within the concave structure to cover the diode chip, and a first interface is formed between the sidewall portion and the transparent encapsulating layer, wherein an angle between the first interface and a connection line between the first contact vertex and the second contact vertex is an acute angle.

In one or more embodiments, a second interface formed between the transparent encapsulating layer and the cap portion includes a curved surface.

In one or more embodiments, the cap portion covers the electrically conductive layer.

In one or more embodiments, the opaque encapsulating layer includes black encapsulating glue.

In one or more embodiments, the opaque encapsulating layer includes white encapsulating glue.

In one or more embodiments, the diode chip is a light-emitting diode.

In one or more embodiments, the diode chip is a photo-diode.

In one or more embodiments, the diode chip is a Zener diode.

In summary, the diode package structure and its manufacturing method disclosed herein can make the two interfaces joined by the transparent encapsulating layer and the opaque encapsulating layer form an acute angle, which is less prone to peeling during thermal expansion and contraction compared to a circular leading angle at the encapsulating layer interface of the conventional diode package structure.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
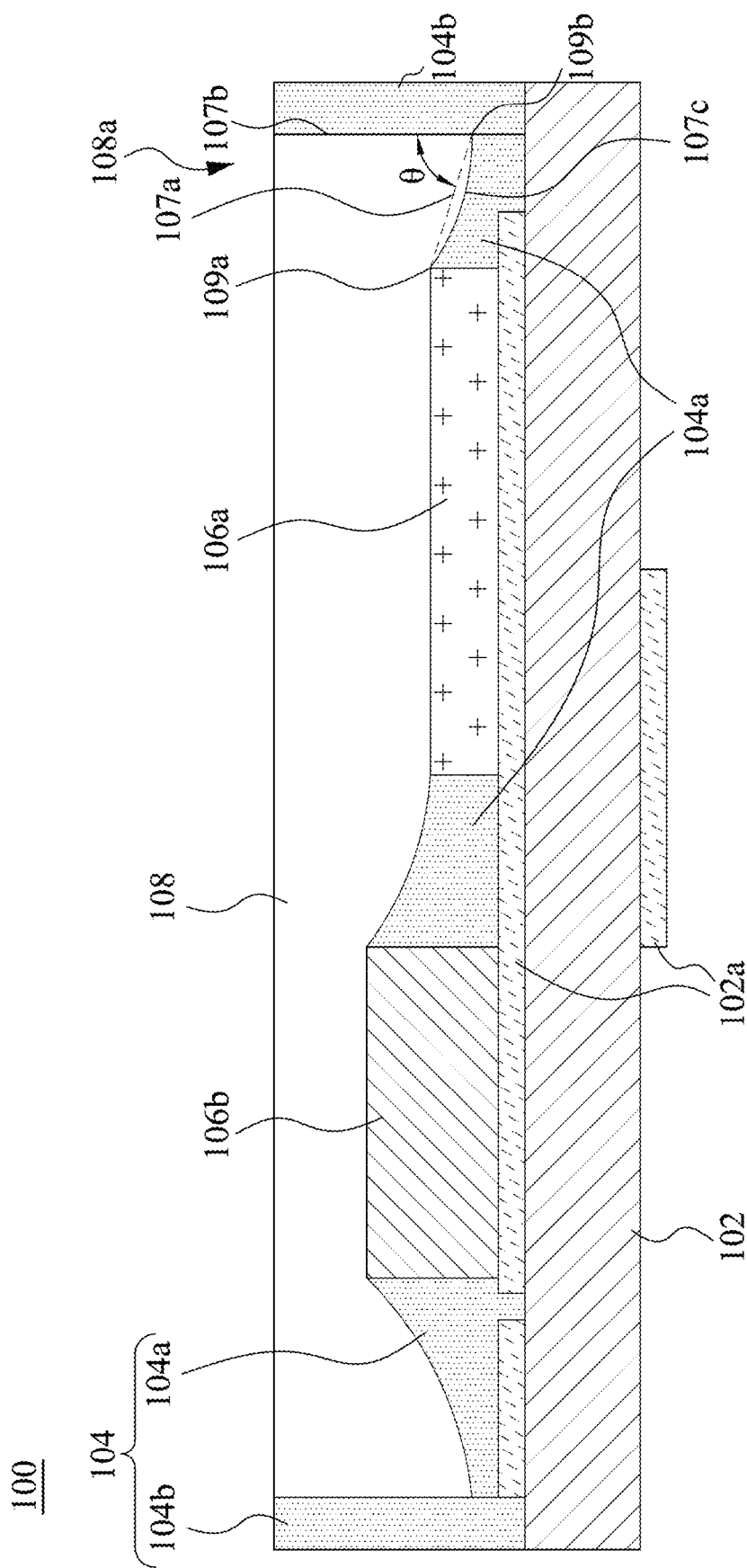
FIG. 1 illustrates a cross sectional view of a diode package structure in accordance with an embodiment of the present disclosure.

It is to be noted that the following descriptions of preferred embodiments of this disclosure are presented herein for purpose of illustration and description only. It is not intended to be exhaustive or to be limited to the precise form disclosed. Also, it is also important to point out that there may be other features, elements, steps and parameters for implementing the embodiments of the present disclosure which are not specifically illustrated. Thus, the specification and the drawings are to be regard as an illustrative sense rather than a restrictive sense. Various modifications and similar arrangements may be provided by the persons skilled in the art within the spirit and scope of the present disclosure. In addition, the illustrations may not necessarily be drawn to scale, and the identical elements of the embodiments are designated with the same reference numerals.

Reference is made to FIG. 1, which illustrates a cross sectional view of a diode package structure in accordance with an embodiment of the present disclosure. The diode package structure 100 includes a substrate 102, at least one diode chip, and an encapsulating layer. In some embodiments of the present disclosure, the substrate 102 has an electrically conductive layer 102a to conduct electric current required for operating the diode. In some embodiments of the present disclosure, the substrate 102 may be a flat plate, for example, a BT board, an EMC board, an SMC board, a ceramic board, a PCB board, or a Sapphire board. In some embodiments of the present disclosure, the electrically conductive layer 102a may be a metal plated layer, but is not limited thereto.

In some embodiments of the present disclosure, the diode chip 106a may be a light-emitting diode, and the diode chip 106b may be a Zener diode or a photodiode. In some embodiments of the present disclosure, the diode chip 106a may be a light-emitting diode, and the diode chip 106b may also be a light-emitting diode (for example, a light-emitting diode of a different color). In some embodiments of the present disclosure, the diode chips (106a, 106b) can both be Zener diodes or photodiodes. The diode chip (106a, 106b) is die-bonded on the substrate 102 and is electrically connected to the electrically conductive layer 102a on the substrate 102 (for example, achieved by wire bonding or welding). In some embodiments of the present disclosure, the diode chip may be a traditional face-up chip, a vertical chip or a flip chip.

In some embodiments of the present disclosure, the encapsulating layer may include a transparent encapsulating layer 108 and an opaque encapsulating layer 104. The opaque encapsulating layer 104 has a cap portion 104a and a sidewall portion 104b, and the sidewall portion 104b is connected to and surrounds the substrate 102 to form a concave structure 108a. The cap portion 104a is connected between adjacent diode chips (106a, 106b), and between the sidewall of the diode chip (106a or 106b) and the sidewall portion 104b, so as to shield or cover the upper surface of the substrate 102 or the electrically conductive layer 102a. Therefore, the components and the electrically conductive layer will not have color shift or brightness degradation due to oxidation and discoloration, which can increase the product life. In some embodiments of the present disclosure, the cap portion 104a and the sidewall portion 104b may be the same encapsulating layer, so as to avoid interface peeling problems or other shortcomings caused by different materials. In some embodiments of the present disclosure, the opaque encapsulating layer 104 can be a white encapsulating layer or a black encapsulating layer, so as to meet different application environments. For example, the white encapsulating layer can increase the light reflectivity to enhance the light efficiency by about 3% to 40%, and the black encapsulating layer can reduce the noise ratio of optical components. In some embodiments of the present disclosure, the transparent encapsulating layer 108 is filled into the concave structure 108a formed by the sidewall portion 104b and the substrate 102 to cover the diode chips (106a, 106b), and forms a second interface 107c with the cap portion 104a. In some embodiments of the present disclosure, the transparent encapsulating layer 108 may be organic glue, inorganic glue, or a mixture thereof in any ratio, such as silicon, epoxy, fluorine, etc. In some embodiments of the present disclosure, the opaque encapsulating layer 104 may be an organic glue or an inorganic glue, and may include ceramic, metal, glass, titanium dioxide, or silicon dioxide.

In some embodiments of the present disclosure, a first contact vertex 109a (i.e., an interface peak) of the cap portion 104a and a sidewall of the diode chip 106a is higher than a second contact vertex 109b (i.e., an interface peak) of the cap portion 104a and the sidewall portion 104b. In some embodiments of the present disclosure, a first interface 107b is formed between the transparent encapsulating layer 108 and the sidewall portion 104b, wherein an angle θ between the first interface 107b and a connection line 107a between the first contact vertex 109a and the second contact vertex 109b is an acute angle such that the interface (i.e., 107b and 107c) between the transparent encapsulating layer 108 and the opaque encapsulating layer 104 is less likely to cause peeling problems.

In some embodiments of the present disclosure, a second interface 107c formed between the transparent encapsulating layer 108 and the cap portion 104a includes a curved surface.

Figure 2:
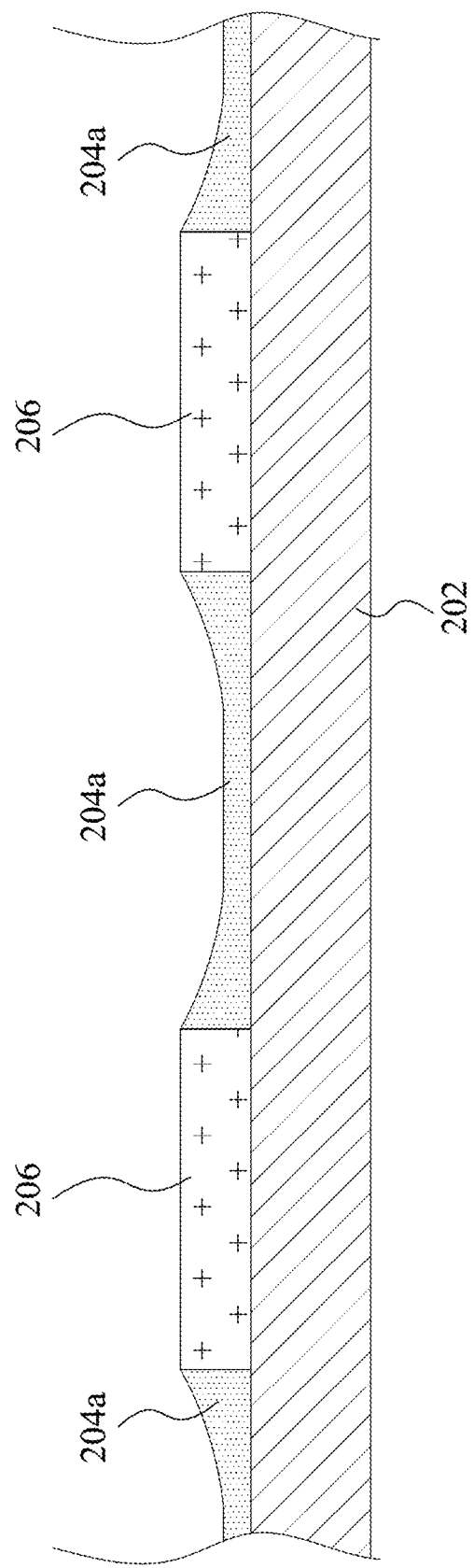
FIGS. 2-4 illustrate manufacturing steps of cross sectional views of a diode package structure in accordance with embodiments of the present disclosure.
Figure 3:
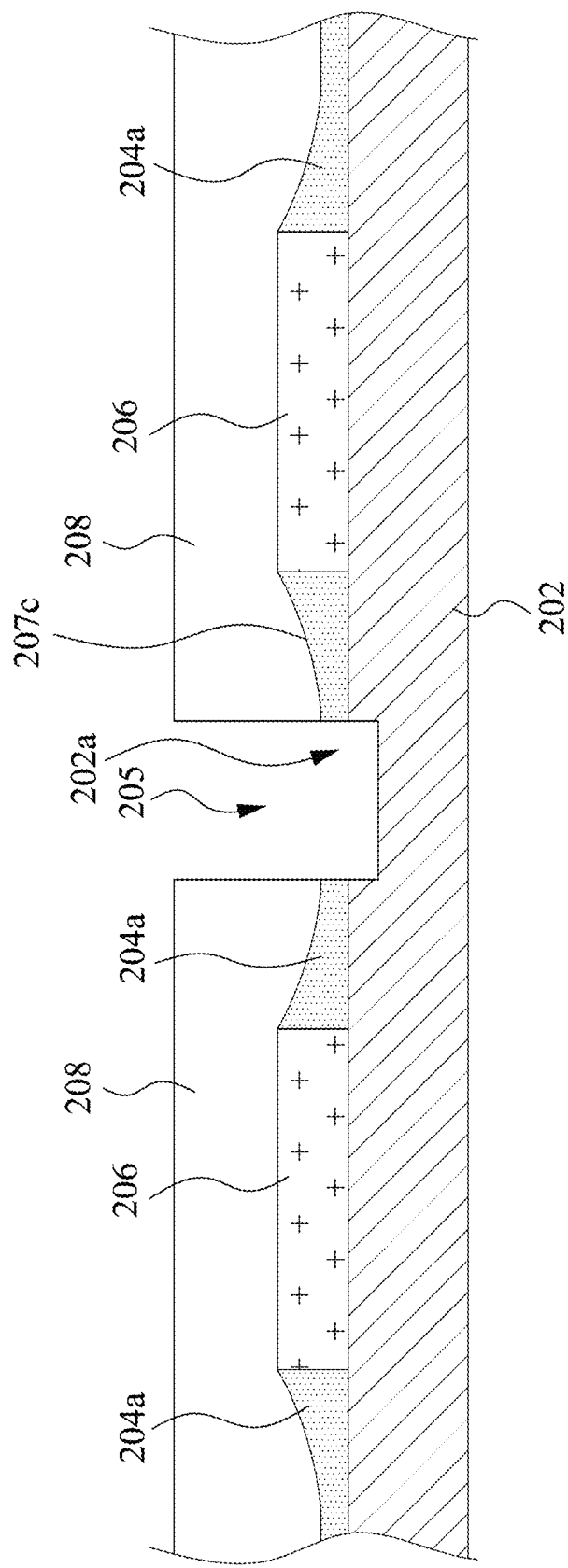
Figure 4:
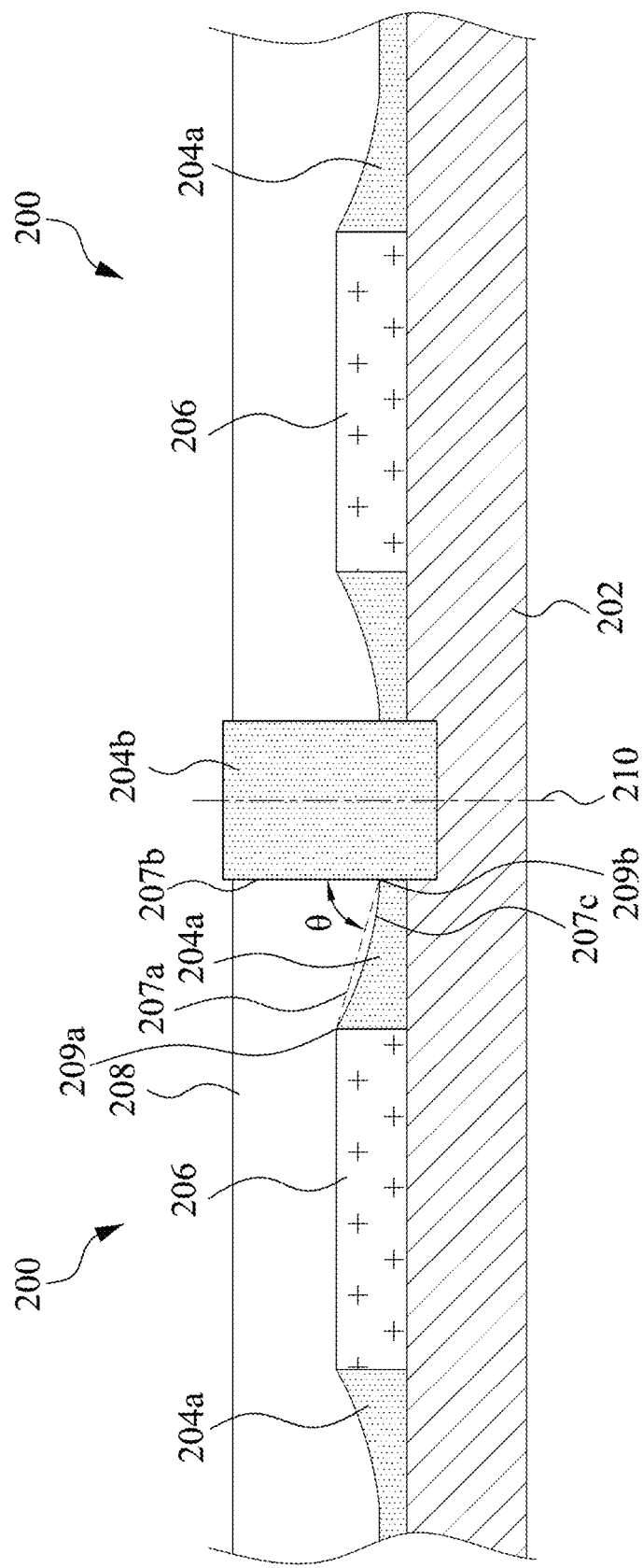

Reference is made to FIGS. 2-4, which illustrate manufacturing steps of cross sectional views of a diode package structure in accordance with embodiments of the present disclosure.

In FIG. 2, a substrate 202 is provided, and a plurality of diode chips 206 are die-bonded on the substrate 202, and each diode chip 206 is electrically connected to the substrate 202. Next, a first opaque encapsulating layer 204a is formed between adjacent diode chips 206, thereby forming a cap portion similar to that in FIG. 1. In some embodiments of the present disclosure, the diode chip 206 may be at least one of a light-emitting diode, a photodiode, and a Zener diode. In some embodiments of the present disclosure, the substrate 202 may be a flat plate, such as a BT board, an EMC board, an SMC board, a ceramic board, a PCB board, or a Sapphire board. In some embodiments of the present disclosure, the diode chip 206 may be a traditional face-up chip, a vertical chip or a flip chip.

In FIG. 3, a transparent encapsulating layer 208 is formed to cover the diode chips 206 and the first opaque encapsulating layer 204a. An interface 207c is formed between the transparent encapsulating layer 208 and the first opaque encapsulating layer 204a. Then, a trench 205 is formed in an area where the transparent encapsulating layer 208 and the first opaque encapsulating layer 204a are overlapped or laminated to expose the substrate 202. In some embodiments of the present disclosure, a portion of trench 205 includes a groove 202a on a surface of the substrate 202.

In FIG. 4, the trench 205 is filled with a second opaque encapsulating layer 204b to form the aforementioned sidewall portion 104b. A first contact vertex 209a (i.e., an interface peak) of the first opaque encapsulating layer 204a and the sidewall of the diode chip 206 is higher than a second contact vertex 209b (i.e., an interface peak) of the first opaque encapsulating layer 204a and the second opaque encapsulating layer 204b. Then, diode package structure monomers 200 can be separated by cutting along a cutting line 210. In some embodiments of the present disclosure, each diode package structure monomer 200 may also include two or more diode chips 206, for example, the diode package structure includes a light-emitting diode, a photodiode, or a Zener diode, or multiple light-emitting diodes, multiple photodiodes or multiple Zener diodes.

In some embodiments of the present disclosure, an interface 207b is formed between the transparent encapsulating layer 208 and the second opaque encapsulating layer 204b, and an angle θ between the interface 207b and a connection line 207a between the first contact vertex 209a and the second contact vertex 209b is an acute angle, which makes the interfaces (i.e., interfaces 207b and 207c) between the transparent encapsulating layer 208, the first opaque encapsulating layer 204a and the second opaque encapsulating layer 204b less likely to cause peeling problems.

In some embodiments of the present disclosure, the first opaque encapsulating layer 204a and the second opaque encapsulating layer 204b may be the same encapsulating layer, so as to avoid interface peeling problems or other shortcomings caused by different materials. In some embodiments of the present disclosure, the first opaque encapsulating layer 204a and the second opaque encapsulating layer 204b may be white or black encapsulating layers, so as to meet different application environments. For example, a white encapsulating layer can increase light reflectivity to enhance light efficiency by about 3% to 40%, and a black encapsulating layer can reduce the noise ratio of optical components. In some embodiments of the present disclosure, the transparent encapsulating layer 208 can be organic glue, inorganic glue or a mixture thereof in any ratio, such as silicon, epoxy, fluorine, etc. In some embodiments of the present disclosure, the first and second opaque encapsulating layers (204a, 204b) can be organic glue or inorganic glue, and can include ceramics, metals, glass, titanium dioxide, or silicon dioxide.

In summary, the diode package structure and its manufacturing method disclosed herein can make the two interfaces joined by the transparent encapsulating layer and the opaque encapsulating layer form an acute angle, which is less prone to peeling during thermal expansion and contraction compared to a circular leading angle at the encapsulating layer interface of the conventional diode package structure.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A diode package structure manufacturing method comprising:
   providing a substrate;
   mounting diode chips on the substrate;
   forming a first opaque encapsulating layer among the diode chips;
   forming a transparent encapsulating layer to cover the diode chips and the first opaque encapsulating layer;
   forming a trench to expose the substrate in an area where the transparent encapsulating layer and the first opaque encapsulating layer are overlapped; and
   filling a second opaque encapsulating layer in the trench, wherein a first contact vertex of the first opaque encapsulating layer and a sidewall of each diode chip is higher than a second contact vertex of the first opaque encapsulating layer and the second opaque encapsulating layer.

2. The method of claim 1, wherein an interface is formed between the transparent encapsulating layer and the second opaque encapsulating layer, an angle between the interface and a connection line between the first contact vertex and the second contact vertex is an acute angle.

3. The method of claim 1, wherein the first and second opaque encapsulating layers comprise white encapsulating glue.

4. The method of claim 1, wherein the first and second opaque encapsulating layers comprise black encapsulating glue.

5. The method of claim 1, wherein the diode chips comprise light-emitting diodes.

6. The method of claim 1, wherein the diode chips comprise photodiodes.

7. The method of claim 1, wherein the diode chips comprise Zener diodes.

* * * * *